March 5, 1968

J. H. FEIT 3,372,348

OSCILLATOR HAVING PIEZOELECTRIC ELEMENTS OPERATING AT DIFFERENT HARMONIC MODES

Filed May 2, 1966

Inventor
JAMES H. FEIT

BY Mueller, Aichele & Rauner

ATTYS.

3,372,348
Patented Mar. 5, 1968

3,372,348

OSCILLATOR HAVING PIEZOELECTRIC ELEMENTS OPERATING AT DIFFERENT HARMONIC MODES

James H. Feit, Chicago, Ill., assignor to Motorola, Inc., Franklin Park, Ill., a corporation of Illinois Filed May 2, 1966, Ser. No. 546,683
4 Claims. (Cl. 331—116)

ABSTRACT OF THE DISCLOSURE

Crystal oscillator circuit including two piezoelectric resonators having different natural resonant frequencies and operating at different overtone modes to respond at the same frequency. One resonator is connected in the frequency determining portion of the oscillator and the second resonator is connected in the feedback path for the oscillator. The oscillator includes a transistor and the feedback is from either the emitter electrode or the collector electrode to the base electrode.

This invention relates generally to crystal oscillators, and more particularly to an electronic oscillator circuit having a plurality of piezoelectric elements for controlling the frequency.

Electronic oscillators using piezoelectric elements for providing frequency control are well known in the art. It is also known to operate the piezoelectric elements in an overtone mode so that the oscillator frequency is several times greater than the actual resonant frequency of the piezoelectric element. In order to prevent oscillation at modes other than the desired mode, a coil has been used in the circuit to prevent such undesired modes of oscillation.

In order to provide electronic devices in small and inexpensive form, it has been proposed to provide the various components in integrated circuit form. That is, a plurality of components are formed on a single semiconductor chip so that the circuit is provided in a very small physical configuration. As it is impractical to provide inductors or coils in integrated circuit form, it is desired to provide circuits which do not require inductance.

It is an object of the present invention to provide a high frequency electronic oscillator controlled by piezoelectric elements which can be constructed in integrated circuit form.

Another object of the invention is to provide an oscillator having piezoelectric elements operating at a harmonic mode, and which does not require a coil to suppress undesired modes of oscillation.

A feature of the invention is the provision of a piezoelectric oscillator including a plurality of piezoelectric elements having different natural resonant frequencies and a common overtone frequency and wherein the oscillator circuit including the piezoelectric elements operates at the overtone frequency which is common to the piezoelectric elements but will not operate at any other frequency.

Another feature of the invention is the provision of a crystal oscillator circuit including a transistor with a frequency determining circuit including a first piezoelectric element and capacitors which form a tuned circuit, and with a feedback circuit including a second piezoelectric element coupled to the transistor so that oscillations are produced at a single frequency. The piezoelectric elements have different natural resonant frequencies and operate at different overtone modes to provide the same frequency, so that the oscillator can operate at this common frequency.

The invention is illustrated in the drawing wherein.

In accordance with the invention, an oscillator circuit is provided which includes two piezoelectric elements such as quartz crystals or barium titanate resonators, both of which are operated at overtone modes to provide high frequency oscillations. The two piezoelectric elements have different resonant frequencies of operation and operate at different overtones to provide the oscillator frequency. One element may be connected in parallel with capacitors to form a resonant circuit, with the element operating between series and parallel resonance at an overtone mode at the oscillator frequency. The other piezoelectric element can be placed in the feedback circuit, and operates at series resonance at the oscillator frequency, at an overtone mode, so that feedback is provided at this frequency. A transistor may be used as the active element in the circuit and the feedback can be provided between the electrodes thereof, as from the emitter electrode to the base electrode, or from the collector electrode to the base electrode.

Figure 1:
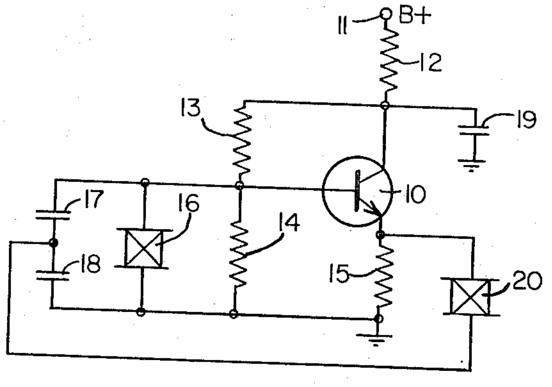
FIG. 1 illustrates the oscillator circuit with one piezoelectric element in the tuned circuit and another in the feedback path.

Referring now to the drawings, in FIG. 1 there is shown an oscillator circuit including a transistor 10 of the NPN type. A bias is applied to the collector electrode from the positive potential terminal 11 through resistor 12, and the resistors 12, 13 and 14 form a voltage divider for providing a bias potential to the base electrode. The emitter electrode is connected to ground through resistor 15, and the collector electrode is bypassed by capacitor 19. Piezoelectric element 16 and capacitors 17 and 18 form the resonance circuit for the oscillator. Piezoelectric element 16 operates in an overtone mode and forms an effective inductance to resonate the capacitors 17 and 18 at the oscillator frequency. As an example, piezoelectric element 16 may have a natural frequency of the order of 20 megacycles and may operate at the seventh overtone to provide an oscillator frequency of 140 megacycles.

In the circuit of FIG. 1, feedback is provided from the emitter electrode of transistor 10 to the junction point between capacitors 17 and 18 through the piezoelectric element 20. Piezoelectric element 20 may have a natural resonant frequency of 28 megacycles and may be operated at series resonance at the fifth overtone, so that it has a low impedance at 140 megacycles. Since the natural resonant frequencies of the elements 16 and 20 are substantially different, the circuit cannot oscillate at an undesired mode. Assuming that the piezoelectric element 16 would tend to operate at its fifth overtone instead of its seventh overtone, this would provide a frequency of 100 megacycles and the element 20 would have a high impedance at this frequency. The piezoelectric element 20 would operate at its third mode at 84 megacycles and at its fourth mode at 112 megacycles. These frequencies are widely spaced from the 100 megacycle frequency of element 16. The same situation occurs at other overtones and the components of the circuit do not permit oscillation at any frequency other than the desired one, i.e. 140 megacycles.

Figure 2:
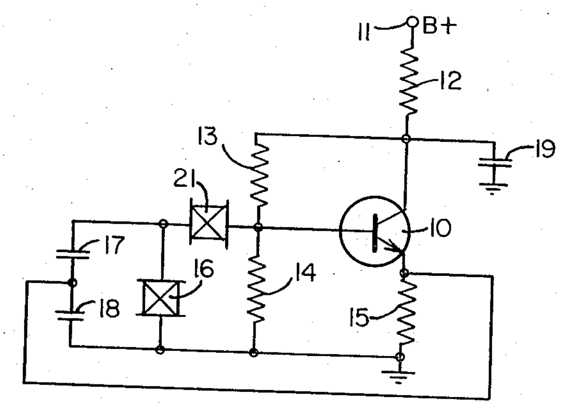
FIG. 2 is a second embodiment of the system of FIG. 1.

The circuit of FIG. 2 is essentially the same as the circuit of FIG. 1 except the piezoelectric element 21 is positioned at a different point in the feedback path between the emitter and base electrodes of transistor 10. The element 21 is positioned between the resonant circuit and the base electrode in FIG. 2, rather than between the emitter electrode and the resonant circuit. The operation is the same as described in connection with FIG. 1.

Figure 3:
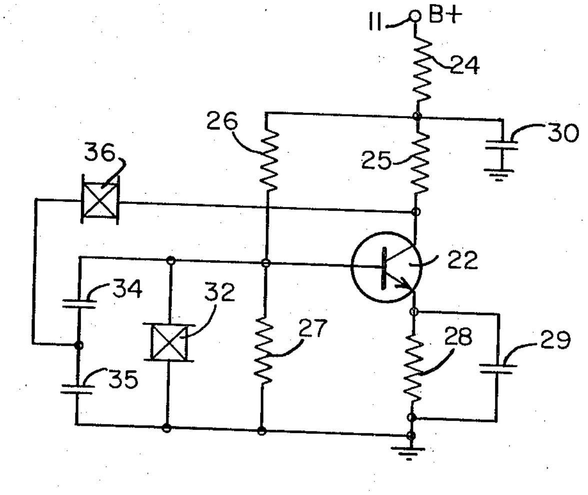
FIG. 3 is a further embodiment wherein feedback is from the collector electrode of the transistor to the base electrode.

FIG. 3 shows a somewhat different embodiment wherein feedback is provided from the collector electrode of the transistor to the base electrode. Transistor 22 has its collector electrode connected to the positive terminal 11 through resistors 24 and 25, with the junction between resistors 24 and 25 being bypassed by capacitor 30. Resistors 24, 26 and 27 form a voltage divider to provide the base potential, and the emitter is grounded through parallel circuit including resistor 28 and capacitor 29. The tuned circuit for the oscillator is formed by piezoelectric element 32 which is bridged by capacitors 34 and 35. Feedback is provided from the collector electrode through piezoelectric element 36 to the junction between capacitors 34 and 35.

The piezoelectric elements operate in the same manner as described in connection with FIG. 1. The natural resonant frequencies of the elements 32 and 36 are different, and they operate at different overtones to provide a common oscillator frequency. Since each element will present a high impedance at the natural resonant frequency and overtone frequencies of the other element, except at the selected overtone, the oscillator will operate only at the single frequency which is the common overtone of the two piezoelectric elements.

The circuits described are of simple configurations which can be easily provided in integrated form. This permits construction in a very compact configuration and by mass production methods.

I claim:

1. A crystal oscillator circuit including in combination, an electron control device having a control electrode and first and second output electrodes, and a circuit connected to said control device including a frequency determining portion coupled to said control electrode and a feedback portion coupling one of said output electrodes to said control electrode, said circuit including first and second piezoelectric elements having different natural resonant frequencies, said first element being in said frequency determining portion and operating in an overtone mode to tune the oscillator circuit to a predetermined frequency, said second element being in said feedback portion and operating in a different overtone mode from that of said first element and providing a high impedance at the resonant frequencies of said first element other than at said predetermined frequency, so that oscillations are produced at said predetermined frequency.

2. The oscillator circuit of claim 1 wherein said second piezoelectric element is series resonant in an overtone mode at said predetermined frequency.

3. The oscillator circuit of claim 2 wherein said electron control device is a transistor having base, emitter and collector electrodes, and said feedback portion is coupled between said base and emitter electrodes.

4. The oscillator circuit of claim 2 wherein said electron control device is a transistor having base, emitter and collector electrodes, and said feedback portion is coupled between said collector and base electrodes.

References Cited

UNITED STATES PATENTS 2,742,573 4/1956 Seeley -------------- 331—162

OTHER REFERENCES

Newhoff: "Crystal-Controlled Multivibrator Has Better Stability," Electronics April 12, 1963, pp. 60, 61.

ROY LAKE, *Primary Examiner.*

S. H. GRIMM, *Assistant Examiner.*